United States Patent
Lin (10) Patent No.: US 7,233,270 B2
(45) Date of Patent: Jun. 19, 2007

(54) RECEIVER CAPABLE OF CORRECTING MISMATCH OF TIME-INTERLEAVED PARALLEL ADC AND METHOD THEREOF

(75) Inventor: Chia-Liang Lin, Union City, CA (US)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 11/164,491

(22) Filed: Nov. 25, 2005

(65) Prior Publication Data

US 2006/0170581 A1    Aug. 3, 2006

Related U.S. Application Data

(60) Provisional application No. 60/593,605, filed on Jan. 28, 2005.

(51) Int. Cl.
*H03M 1/10* (2006.01)
(52) U.S. Cl. ........................................ 341/118; 375/261
(58) Field of Classification Search ................ 341/118, 341/120, 123; 375/261
See application file for complete search history.

(56) References Cited

U.S. PATENT DOCUMENTS 4,763,105 A * 8/1988 Jenq ............................ 341/120
6,384,756 B1   5/2002 Tajiri et al.
6,407,687 B2   6/2002 Martin et al.
6,476,754 B2  11/2002 Lowenborg et al.
6,522,282 B1   2/2003 Elbornsson
6,570,410 B2   5/2003 Manganaro
2002/0122503 A1*  9/2002 Agazzi ........................ 375/316
2004/0120422 A1*  6/2004 Lin et al. .................... 375/316

OTHER PUBLICATIONS

Kurt H. Mueller et al, "Timing Recovery in digital Synchronous Data Receivers", IEEE Transactions on Communications, vol. COM-24, No. 5, May 1976, pp. 516-531.

* cited by examiner

*Primary Examiner*—Howard L. Williams
(74) *Attorney, Agent, or Firm*—Winston Hsu (57) ABSTRACT

A compensation method for a receiver is disclosed, the method includes: receiving and processing an incoming signal to generate an analog input signal; utilizing a time-interleaved parallel analog-to-digital converter (ADC) for converting the analog input signal to a digital input signal according to a plurality of clock signals of different phases; equalizing the digital input signal to generate a plurality of soft decision values; generating a plurality of hard decision values according to the soft decision values; calculating a plurality of error values according to the hard decision values and the soft decision values; and compensating the receiver according to at least part of the error values.

21 Claims, 7 Drawing Sheets

RECEIVER CAPABLE OF CORRECTING MISMATCH OF TIME-INTERLEAVED PARALLEL ADC AND METHOD THEREOF

CROSS REFERENCE TO RELATED APPLICATIONS

This application claims the priority benefit of provisional patent application No. 60/593,605 that was filed on Jan. 28, 2005 and is included herein by reference.

BACKGROUND OF THE INVENTION

1. Field of the Invention

The present invention relates to ADC, and more particularly, to ADC timing and gain mismatch correction.

2. Description of the Prior Art

Figure 1:
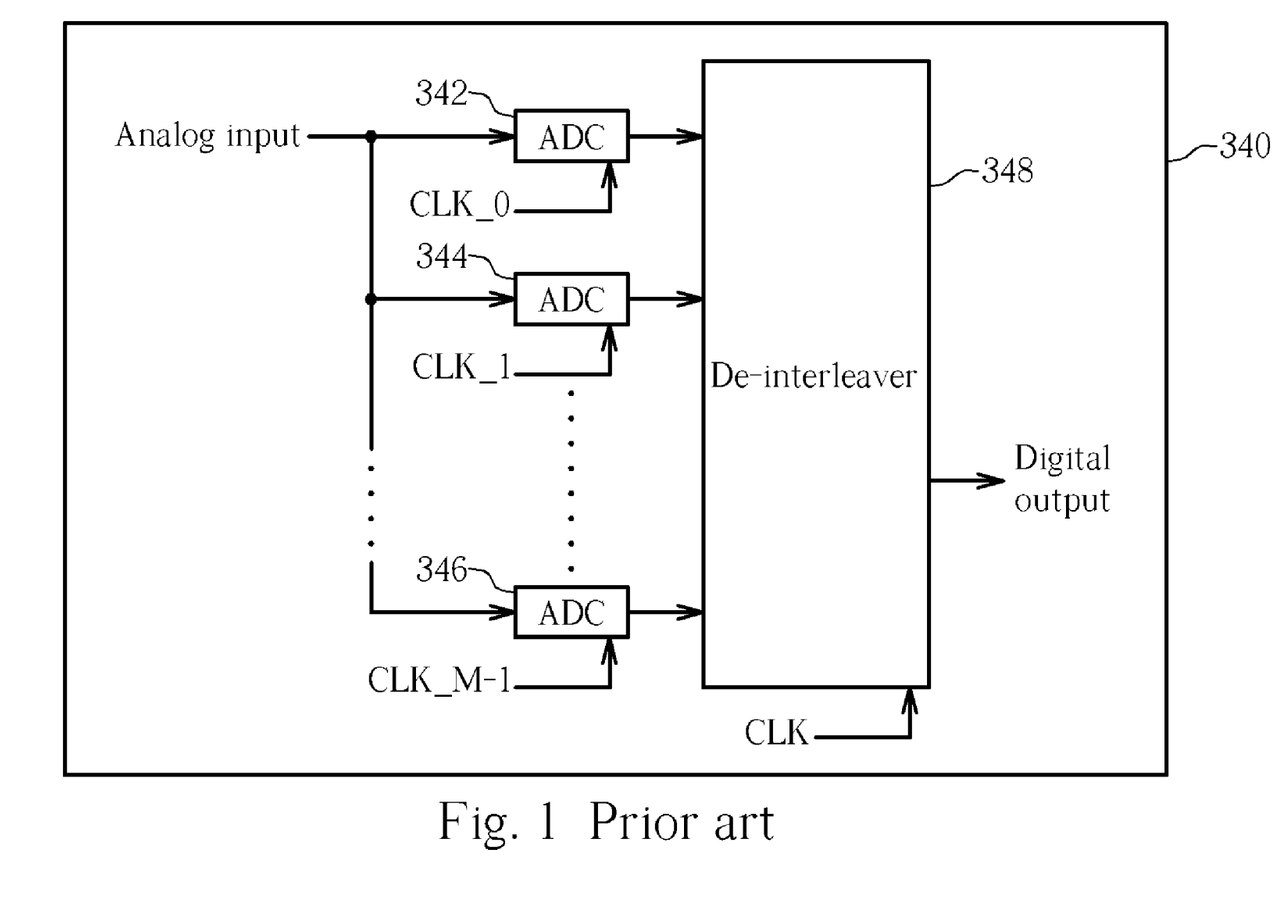
FIG. 1 is a block diagram of a prior art M-fold time-interleaved parallel ADC module.

The analog-to-digital converter (ADC) is a common circuit component utilized in various applications. Time-interleaved parallel ADCs are commonly used, since the time-interleaved parallel architecture is attractive for implementing an ADC with a high sampling rate. Please refer to FIG. 1, which depicts a block diagram of a prior art M-fold time-interleaved parallel ADC module 340, where M is an integer greater than 1. Assume the target sampling rate is f. Using M-fold time-interleaved parallel architecture, one operates each of the M ADC's 342, 344, ..., 346 at a sampling rate of f/M. Each of the ADC's 342, 344, ..., 346 operates at the same sampling frequency of f/M, but at a respective, different phase. The phases of the ADC's 342, 344, ..., 346 must be evenly spaced so as to occupy (i.e., cover) the entire sampling clock period, which is the reciprocal of the frequency f/M. As shown in FIG. 1, each ADC, beginning with ADC 342 (i.e., the first ADC) and through ADC 346 (i.e., the last ADC), uses a respective sampling clock. The clocks are labeled CLK_0 through CLK_M−1, corresponding to the respective clock for ADC's 342 through 346 The output from the M ADCs (342, 344, ..., 346) are provided to a subsequent de-interleaver 348 to construct a digital output for ADC 340. The de-interleaver 348 is operated using clock CLK, which has a frequency that is M-fold higher than each of the sampling clocks CLK_0 through CLK_M−1.

Figure 2:
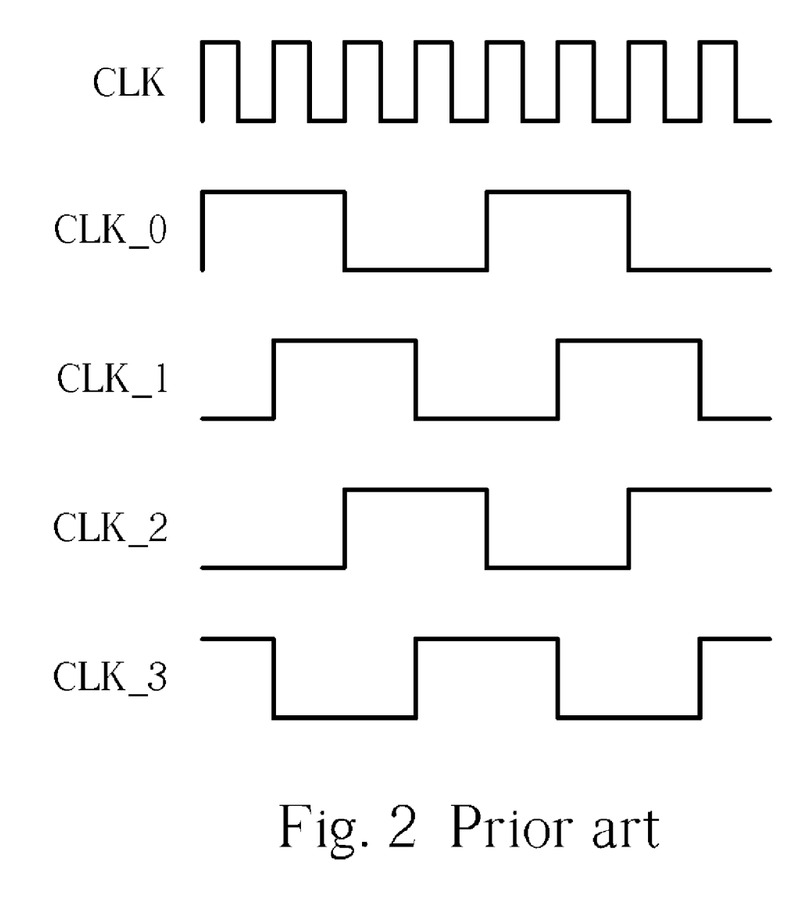
FIG. 2 is an example timing diagram illustrating clocks utilized by the M-fold time-interleaved parallel ADC module shown in FIG. 1 for the example case of M=4.

Please refer to FIG. 2, which shows an example timing diagram illustrating clocks utilized by the M-fold time-interleaved parallel ADC module 340 shown in FIG. 1 for the example case of M=4. As shown in FIG. 2, the frequency of the clock signal CLK is four times of each of those of the clock signals CLK_0–CLK_3. Therefore, the de-interleaver 348 de-interleaves the outputs sequentially generated from the parallel ADC's 342 through 346 to form the desired digital output at a sampling rate of f.

However, in practical applications, the time-interleaved parallel ADC module 340 suffers from two problems. The first problem is called timing skew. To explain timing skew, consider a four-fold parallel architecture as an example. A four-fold time-interleaved parallel ADC module requires four individual clocks, each operating at the same frequency of f/4 but at a different phase. For example, one would like to operate the four clocks at phases of 0, 90, 180, and 270 degrees, respectively. In practical applications, such ideal results are not possible. In real-world applications, the actual clock phases might be, for example, 5, 85, 185, and 265 degrees. These actual clock phases are examples meant to illustrate that the actual clock phase very often differs by several degrees from its ideal phase. The imperfectly timed clocks can result from a number of factors; one for example, is due to the nature of the manufacturing process of the transistors and other circuit components of the clock source. Unfortunately, timing skew degrades the ADC's performance.

Additionally, the time-interleaved parallel ADC suffers from a second problem called amplitude (i.e., gain) mismatch. Amplitude mismatch of the M parallel paths is due to the limited component tolerance and imperfections in the manufacturing process of the circuit elements, i.e., ADC's 342 through 346. Amplitude mismatch will also degrade the ADC's performance.

The following U.S. Patents, for example, are all prior art attempts of mismatch correction schemes: U.S. Pat. No. 6,570,410; U.S. Pat. No. 6,522,282; U.S. Pat. No. 6,476,754; U.S. Pat. No. 6,407,687; U.S. Pat. No. 6,384,756.

However, prior art techniques attempt to solve the mismatch problems by regarding the ADC to be the target device under test. Prior art correction schemes inject a pre-known calibration signal at the ADC input and then estimate the mismatch based on the ADC's output. Alternatively, prior art correction schemes may also simply use the unknown analog input under normal operations and estimate the mismatch based on the statistics of the ADC output. These techniques for correcting timing skew and amplitude mismatch in a time-interleaved parallel ADC do not consider the overall performance of an application that utilizes the time-interleaved parallel ADC. For instance, if the time-interleaved parallel ADC to be calibrated is applied in a receiver, the receiver performance, therefore, is not optimized.

SUMMARY OF THE INVENTION

It is therefore one of the objectives of the claimed invention to provide a receiver for correcting mismatch and the related method thereof, to solve the above problem.

To achieve the above-mentioned object, a compensation method and apparatus for a receiver is provided, the method comprises: receiving and processing an incoming signal to generate an analog input signal; utilizing a time-interleaved parallel analog-to-digital converter (ADC) for converting the analog input signal to a digital input signal according to a plurality of clock signals of different phases; equalizing the digital input signal to generate a plurality of soft decision values; generating a plurality of hard decision values according to the soft decision values; calculating a plurality of error values according to the hard decision values and the soft decision values; and compensating the receiver according to at least part of the error values.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one of ordinary skill in the art will appreciate, consumer electronic equipment manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." The terms "couple" and "couples" are intended to mean either an indirect or a direct electrical connection. Thus, if a first device couples to a second device, that connection may be through a direct electrical connection, or through an indirect electrical connection via other devices and connections.

The present invention discloses a solution, a system for, and a method of correcting mismatch errors of parallel ADC's, specifically, the problems of timing skew and amplitude mismatch. The present invention merely considers the circuit components related to calibrating the ADC of the receiver, and only these circuit components are shown in the drawings. The mismatch of the time-interleaved parallel ADC is best corrected when consideration is given to the overall context of the receiver, to optimize the receiver performance, rather than attempting various isolated incremental improvements focused on individual components of the receiver.

Figure 3:
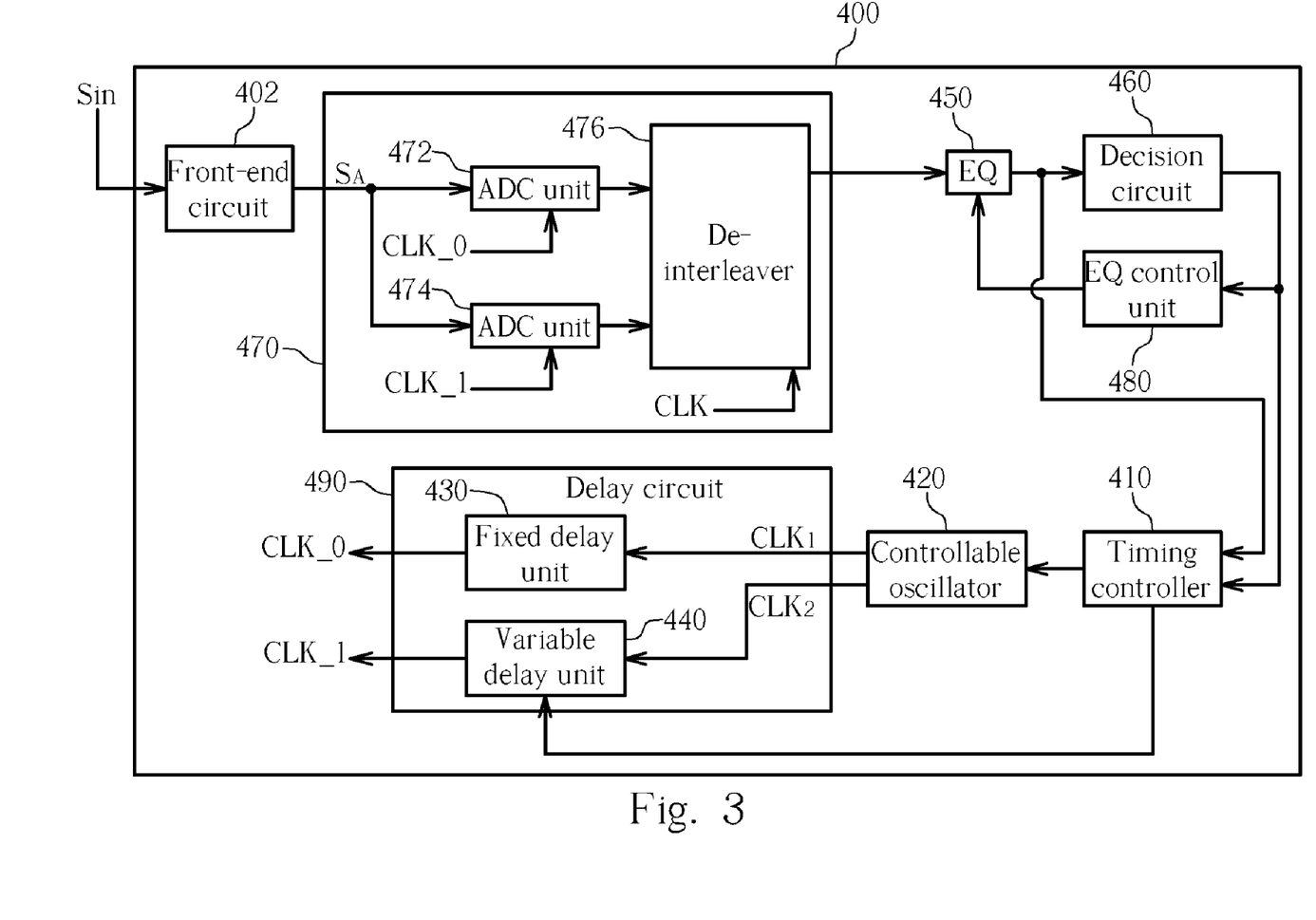
FIG. 3 is a block diagram of a receiver utilizing an M-fold time-interleaved parallel ADC circuit according to a first exemplary embodiment of the present invention for the example case of M=2.

Please refer to FIG. 3, which shows a block diagram of a receiver 400 utilizing an M-fold time-interleaved parallel ADC circuit according to a first exemplary embodiment of the present invention for the example case of M=2. Please note that by way of example, and not limitation, a two-fold parallel architecture is shown in FIG. 3, however, this can easily be generalized to M>2. Initially, a wireless or wire-lined communication signal $S_{in}$ is received by a front-end circuit 402 of the receiver 400. In general, the front-end circuit 402 includes an amplifier used to compensate for the amplitude attenuation due to a channel (not shown in the figure) between the receiver 400 and a remote transmitter (not shown in the figure), and a low-pass filter used to filtering out high-frequency noise induced by the channel. Then, the front-end circuit 402 outputs an analog input signal $S_a$ to the two-fold time-interleaved parallel ADC circuit 470. The time-interleaved parallel ADC circuit 470 comprises a plurality of ADC units 472, 474 each operated with an associated sampling clock signal CLK_0, CLK_1. In addition, the time-interleaved parallel ADC circuit 470 includes a de-interleaver 476 capable of de-interleaving outputs from the ADC units 472, 474 according to a clock signal CLK and then outputting signal samples to a subsequent equalizing circuit (EQ) 450. The equalizing circuit 450 compensates for the channel induced frequency response distortion. Next, a decision circuit 460 is utilized to make decisions based on outputs of the equalizing circuit 450. For example, as to each signal sample, the decision circuit 460 determines which value most closely matches what was originally sent from a transmitter. Utilizing this information provided by the decision circuit 460, the equalizer control unit 480 will adaptively adjust the equalizer setting, such as equalizer coefficients, of the equalizing circuit 450.

The present invention utilizes the timing controller 410 for controlling a control input inputted to a controllable oscillator 420 (e.g., a voltage-controlled oscillator or number-controlled oscillator). Based on the control input, the controllable oscillator 420 is designed to output two clock signals $CLK_1$ and $CLK_2$ that are ideally 180 degrees out of phases; for example, the clock signals $CLK_1$ has a phase of 0 degree and the other clock signal $CLK_2$ has a phase of 180 degrees. According to the present invention, a delay circuit 490 including a fixed delay unit 430 and a variable delay unit 440 are implemented to adjust the phases of the incoming clock signals $CLK_1$ and $CLK_2$ and then output the clock signals CLK_0, CLK_1 to the ADC units 472, 474. As shown in FIG. 3, the fixed delay unit 430 is inserted into the 0-degree phase clock path, and a variable delay unit 440 is inserted in the 180-degrees phase clock path. In the example, the fixed delay path is referred to as the "reference path," while the variable delay path is referred to as the "relative path."

Please note that the timing control unit 410 controls both the controllable oscillator 420 and the variable delay unit 440. The timing control unit 410 controls the controllable oscillator 420 to coarsely adjust sampling clocks of the ADC units 472, 474, and controls the variable delay unit 440 to fine-tune the phases of the sampling clocks of the ADC units 472, 474. Therefore, ADC units 472, 474 will be sampling the analog input signal $S_a$ at the optimum timing while the timing mismatch is corrected by the variable delay unit 440. Note how the timing mismatch is corrected is based on the soft and hard decisions of the receiver 400, as opposed to the raw ADC outputs. Therefore, the timing mismatch is corrected to optimize the performance of the receiver 400, as opposed to optimizing only the ADC performance pursued by prior art methods.

The control scheme utilized by the timing controller 410 is disclosed as follows. It is well known to those skilled in the art that there exist numerous schemes for estimating the timing error. For example, Mueller and Muller discloses a scheme that estimates the timing error using the formula 1 shown below:

$$\epsilon = <s_i \cdot h_{i-1} - s_{i-1} \cdot h_i>$$  Formula 1

Please note that the brackets (i.e., < >) denote statistical average in formula 1. In other words, the timing error is equal to the statistical average of the value contained within the brackets < >. In formula 1, $s_i$ is the soft decision sequence and $h_i$ is the hard decision sequence. Concerning formula 1, each soft decision value is provided by the equalizing circuit 450. Second, each hard decision value is provided by the decision circuit 460, and represents the most likely decision level that best matches the original signal that was transmitted by the remote transmitter. The difference between the soft and hard decision values is best minimized as much as possible. To consider the timing mismatch of the clock signals $CLK_1$ and $CLK_2$, it is necessary to utilize two sets of timing error estimates as shown in formula 2 and formula 3 below:

$$\epsilon^{(even)} = <s_{2i} \cdot h_{2i-1} - s_{2i-1} \cdot h_{2i}>$$  Formula 2

$$\epsilon^{(odd)} = \langle s_{2i+1} \cdot h_{2i} - s_{2i} \cdot h_{2i+1} \rangle \qquad \text{Formula 3}$$

The timing error for even samples is used for controlling the controllable oscillator 420 to generate the clock signal $CLK_1$, which is associated with the sampling clock of the ADC unit 472. The difference between the two timing errors, i.e. $\epsilon^{(even)}$ and $\epsilon^{(odd)}$, indicates the timing mismatch between the clock signals $CLK_1$ and $CLK_2$, and is thus used to control the variable delay unit 440. In this manner, the correct sampling points of the analog input signal $S_a$ are obtained. The key feature of this embodiment is to estimate timing errors utilizing soft and hard decision values and then cancel the timing mismatch by tuning the delay amount of the variable delay unit 440. The fixed delay unit 430 is optional, and could be removed according to design requirements. For other embodiments having no fixed delay unit, the timing mismatch can be still corrected by properly adjusting delay amount of the variable delay unit 440 according to the information given by the timing controller 410. The same objective of canceling timing mismatch (i.e., timing skew) between the clock signals $CLK_1$ and $CLK_2$ is achieved.

Figure 4:
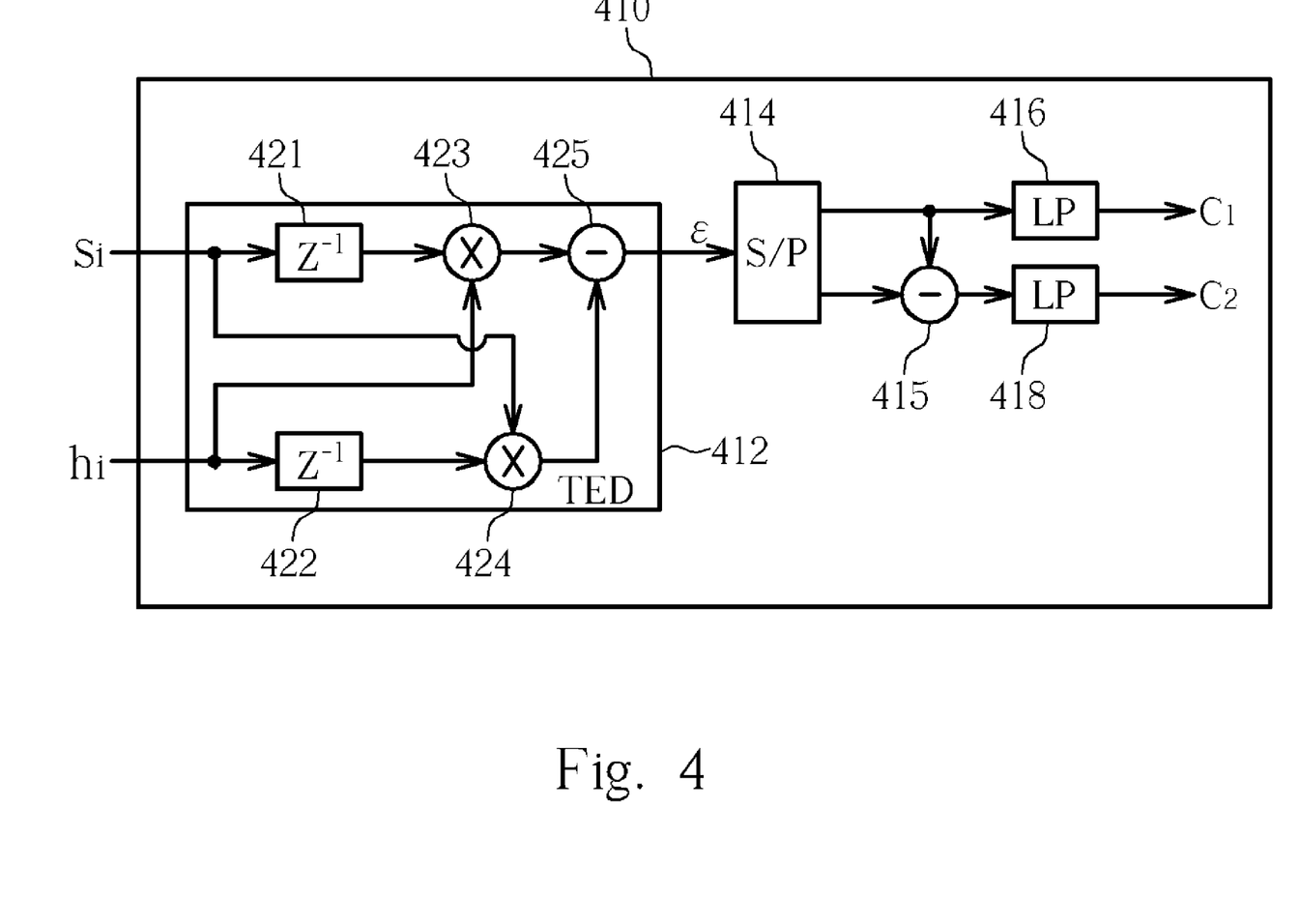
FIG. 4 is a block diagram of the timing controller shown in FIG. 3.

Please refer to FIG. 4. An exemplary embodiment of the timing controller 410 according to the present invention is shown in FIG. 4. Note that the timing error detector (TED) 412 shown here is based on Mueller and Muller scheme, but can be implemented based on whatever valid timing error estimate scheme as desired. The timing error detector 412 includes a plurality of delay operators 421, 422, a plurality of multipliers 423, 424, and a subtractor 425. According to the configuration of the timing error detector 412, it is obvious that the serial timing error estimates: $s_i \cdot h_{i-1} - s_{i-1} \cdot h_i$, are outputted sequentially. Then, the serial-to-parallel converter (S/P) 414 converts the serial timing error estimates into two-fold parallel timing error estimates $\epsilon^{(even)}$ and $\epsilon^{(odd)}$. A subtractor 415 is implemented to compute the difference between the timing error estimates $\epsilon^{(even)}$ and $\epsilon^{(odd)}$. In addition, loop filters 416, 418 perform filtering (e.g., the statistical average function) on the timing error estimate $\epsilon^{(even)}$ and the difference between timing error estimate $\epsilon^{(even)}$ and $\epsilon^{(odd)}$, respectively. The output of the loop filter 416, i.e., the control value $C_1$, also referred to as the reference timing error value, is to control the controllable oscillator 420, while the output of the loop filter 418, i.e., the control value $C_2$, also referred to as the relative timing error value, is to control the variable delay unit 440.

Please note that the aforementioned loop filters 416, 418 are implemented to perform the statistical average function for smoothing control values $C_1$, $C_2$ fed into the controllable oscillator 420 and variable delay unit 440. For those with ordinary skill in the art, the statistical average can be implemented in various ways. For example, it can be implemented by calculating the moving average of last N inputs, where N is an integer.

In the above embodiment, the M-fold time-interleaved parallel ADC circuit implemented in the receiver 400 has a two-fold time-interleaved parallel architecture. However, the invention can be generalized to M>2 as follows. Assume an M-phase clock, for example, with clock phases of 0, 360/M, 720/M, ..., and (M−1)*360/M degrees, is generated by the controllable oscillator 420. The clock signals are labeled CLK_0, CLK_1, ..., and CLK_M−1. A fixed delay unit is still inserted on one clock, say CLK_0 for example. A respective variable delay unit is inserted on all of the other clocks; say clocks CLK_1 to CLK_M−1 for example. In other words, a plurality of variable delay units is implemented. The timing controller controls the controllable oscillator 420, and the (M−1) variable delay units. Use whatever valid timing estimate detector as desired to generate a timing error estimate sequence $\epsilon_i$. Next, perform a serial-to-parallel conversion to generate M-fold timing errors $\epsilon_{i \cdot M+j}$ for j=0, 1, 2, ..., M−1. In the present embodiment as illustrated in FIG. 4 the serial-to-parallel converter 414 performs this function. The timing error $\epsilon_{i \cdot M}$ controls the controllable oscillator; this is referred to as the reference timing path. The respective difference between $\epsilon_{iM+j}$ for j>0 and $\epsilon_{i \cdot M}$ is used to control the variable delay unit corresponding to CLK_j; this is referred to as the relative timing path. It is necessary that each control be processed by a respective loop filter to perform the statistical average function. In this manner, the optimum sampling timing of all of the M-fold ADC's is obtained. For those with ordinary skill in the art, the optimum sampling timing can also be achieved using an interpolation unit inserted between the ADC and the EQ instead of using variable delay circuits.

Figure 5:
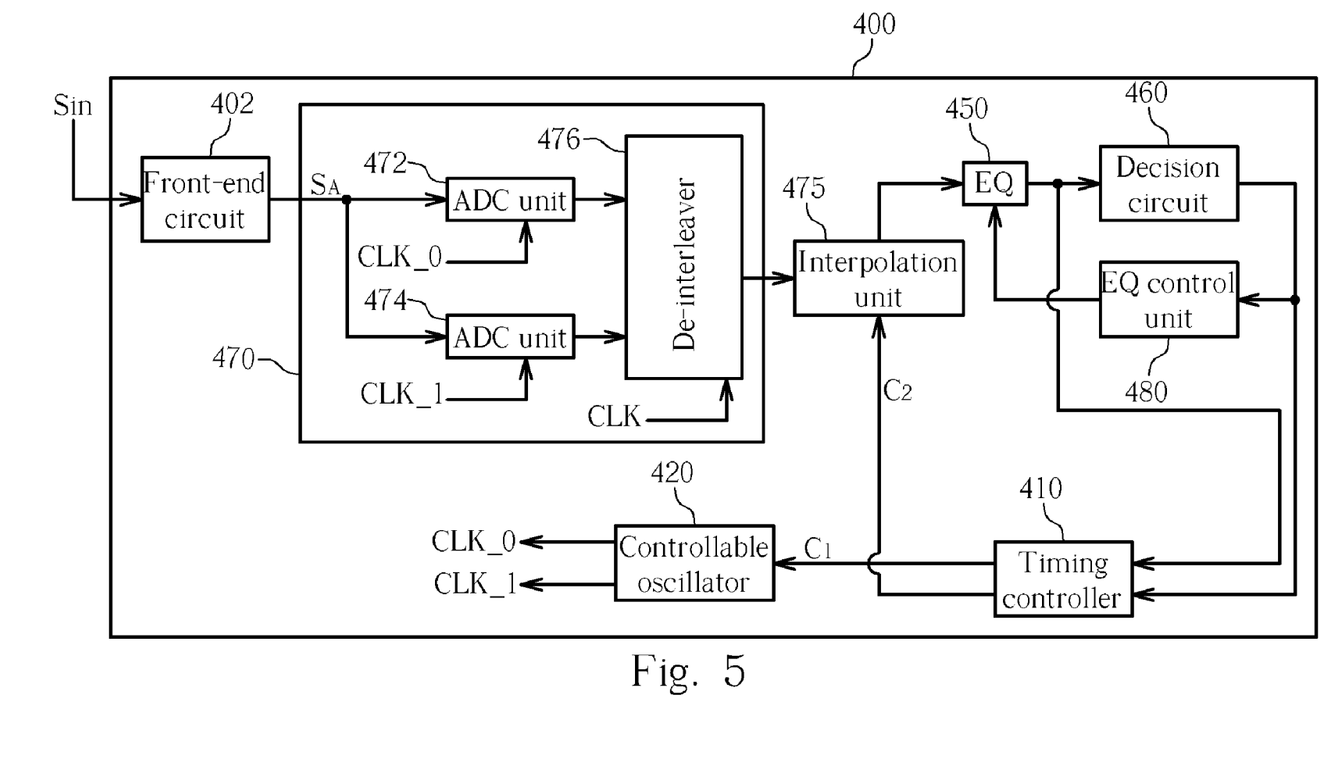
FIG. 5 is a block diagram of a receiver utilizing an M-fold time-interleaved parallel ADC circuit according to an embodiment of the present invention for the example case of M=2.

Please refer to FIG. 5. FIG. 5 shows another embodiment of the present invention. Items with identical functions have been labeled the same as in FIG. 3 and any further description is omitted here for the sake of brevity. In this embodiment, the mismatch in timing is corrected digitally by using, for example, an interpolation unit 475 inserted between the ADC 470 and the EQ 450. The interpolation unit 475 is controlled by the controlled value $C_2$ to interpolate the values of the samples in the relative paths according to the correct timing. Please see FIG. 3 for details regarding the control value $C_2$.

Figure 6:
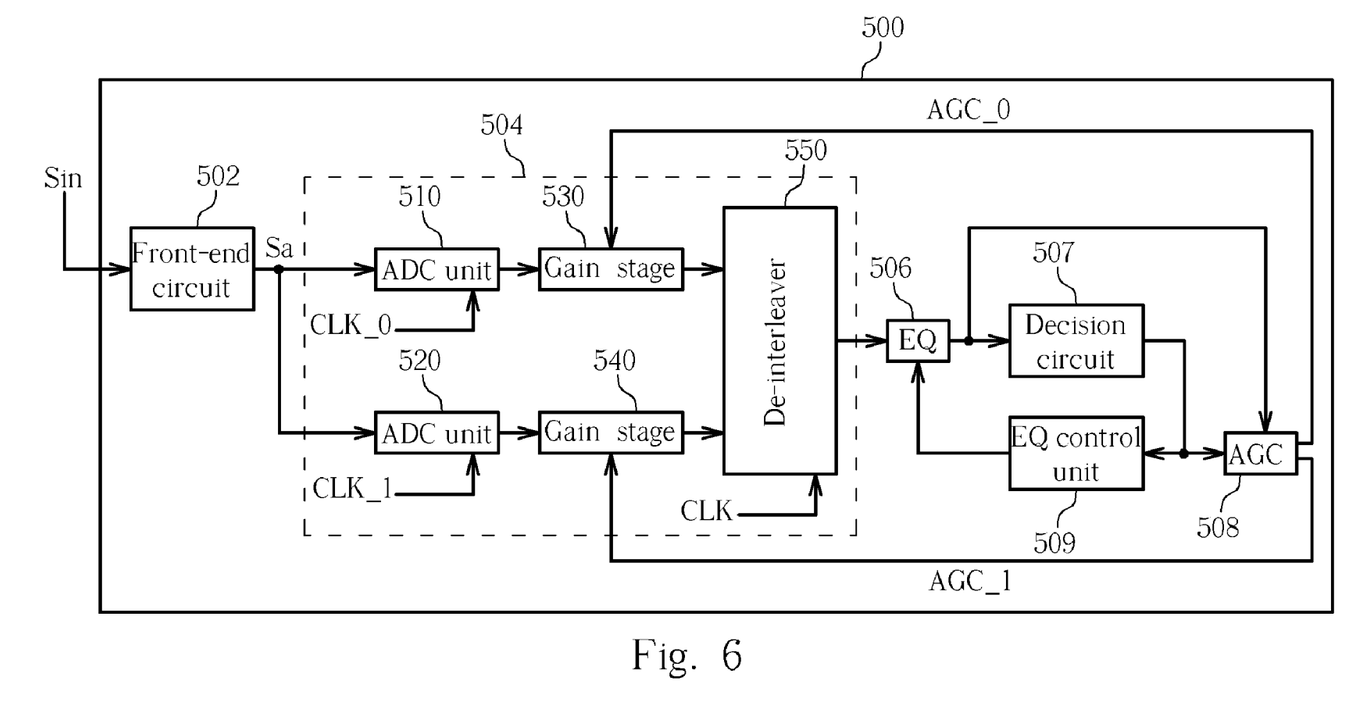
FIG. 6 is a block diagram of a receiver utilizing an M-fold time-interleaved parallel ADC circuit according to a second exemplary embodiment of the present invention for the example case of M=2.

Please refer to FIG. 6, which shows a block diagram of a receiver 500 utilizing an M-fold time-interleaved parallel ADC circuit according to a second exemplary embodiment of the present invention for the example case of M=2. Please note that by way of example, and not limitation, a two-fold parallel architecture is shown in FIG. 6, however, this can easily be generalized to M>2.

In practice, the M-fold time-interleaved parallel ADC also suffers from a mismatch in amplitude (i.e., gain). Prior art efforts to correct the amplitude mismatch utilize the ADC output. According to the present invention, the amplitude mismatch is corrected given the context of the overall receiver performance. An exemplary embodiment for M=2 according to the present invention is shown in FIG. 6. The receiver 500 includes a front-end circuit 502, a time-interleaved parallel ADC 504, an equalizing circuit (EQ) 506, a decision circuit 507, an automatic gain controller (AGC) 508, and an EQ control unit 509. The time-interleaved parallel ADC 504 has a plurality of ADC units 510, 520 driven by clock signals CLK_0, CLK_1, a plurality of gain stages 530, 540 and a de-interleaver 550 driven by a clock signal CLK. In receivers 400, 500 the components of the same name have identical operation and functionality. Therefore, further description is omitted for brevity.

In FIG. 6, the ADC units 510, 520 take as input the analog signal $S_a$ and then deliver their output (signal samples) to subsequent gain stages 530, 540 used for correcting the amplitude mismatch induced from the preceding ADC units 510, 520. As well as receiving their input from the ADC units 510, 520 the gain stages 530, 540 are controlled by control values AGC_0, AGC_1 from AGC 508. That is, the gain values set to the adjustable gain stages 530, 540 are controlled by AGC 508. Operation of the AGC 508 capable of correcting amplitude mismatch is detailed as follows.

Figure 7:
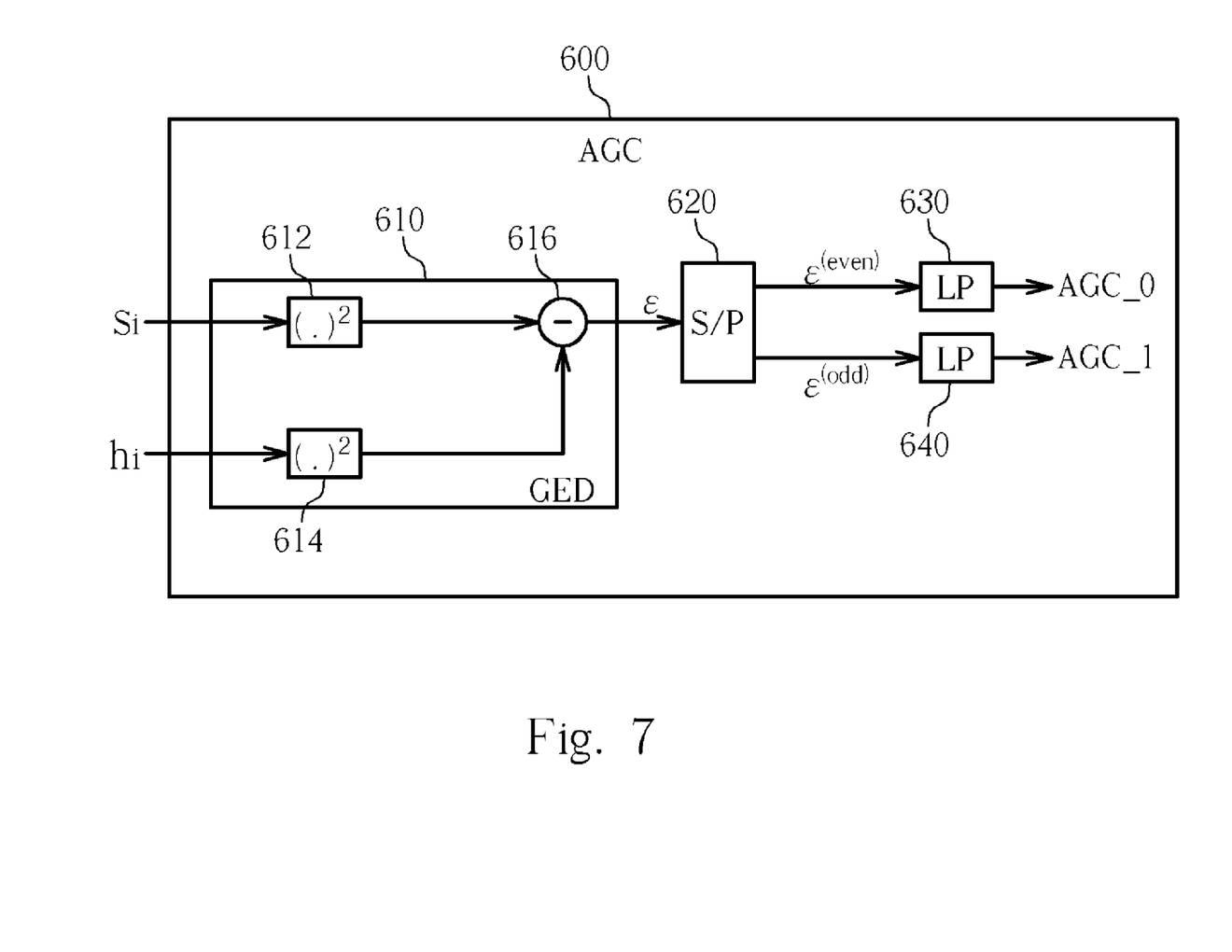
FIG. 7 is a block diagram of the automatic gain controller shown in FIG. 6.

An exemplary embodiment of the AGC 508 according to the present invention is illustrated in FIG. 7. In FIG. 7, a gain error detector (GED) 610 is used to estimate the gain error sequence. A serial-to-parallel converter (S/P) 620 is used to divide the timing error sequence into two sets of gain error, $\epsilon^{(even)}$ and $\epsilon^{(odd)}$ in a manner similar to that of the serial-to-parallel converter 414 shown in FIG. 4. The gain errors from both paths are filtered by respective loop filters 630, 640 and then desired control values AGC_0 and AGC_1 are obtained. By way of example and not limitation, computation of the timing error sequence is based on the following formula:

$$\epsilon = \langle s_i^2 - h_i^2 \rangle \qquad \text{Formula 4}$$

Please note that the brackets (i.e., < >) denote statistical average in formula 4. In other words, the gain error is equal to the statistical average of the value contained within the brackets < >. In formula 4, $s_i$ is the soft decision sequence (output of the equalizing circuit 506) and $h_i$ is the hard decision sequence (output of the decision circuit 507).

The GED 610 contains two square operators 612, 614 for squaring the hard decision value and the soft decision value. The subtractor 616 takes as input the output of the squaring units 612, 614 and then passes that output to the S/P 620 as an input. Loop filters 630, 640 are then used on both the even and odd samples as output by S/P 620 for performing the statistical average function. Finally, control values AGC_0 and AGC_1 are generated to set the gain values of the adjustable gain stages 530, 540. These two control values are generated by the present invention in the context of the overall receiver performance.

Please note that the aforementioned loop filters 630, 640 are implemented to perform the statistical average for smoothing control values AGC_0, AGC_1 fed into the adjustable gain stages 530, 540. For those with ordinary skill in the art, the statistical average can be implemented in various ways. For example, it can be implemented by calculating the moving average of last N inputs, where N is an integer. Furthermore, in practice, any valid gain error detection scheme can be used. Again, this invention can easily be generalized to any M>2 by inserting a gain stage on each of the parallel paths, and then performing gain error estimation of each of the paths utilizing a serial-to-parallel converter.

In a preferred embodiment, the timing mismatch correction scheme shown in FIG. 4 and the amplitude correction scheme shown in FIG. 7 are both implemented in a single receiver for optimum signal receiving performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A receiver comprising:
   a front-end circuit for receiving and processing an incoming signal to generate an analog input signal;
   a time-interleaved parallel analog-to-digital converter (ADC) circuit, coupled to the front-end circuit, for converting the analog input signal into a digital input signal, the time-interleaved parallel ADC circuit comprising a plurality of ADCs driven by a plurality of clock signals of different phases, respectively;
   an equalizing circuit, coupled to the time-interleaved parallel ADC circuit, for equalizing the digital input signal to generate a plurality of soft decision values;
   a decision circuit, coupled to the equalizing circuit, for generating a plurality of hard decision values according to the soft decision values;
   a calculating circuit, coupled to the equalizing circuit and the decision circuit, comprising:
   a first error detector for generating a sequence of first error estimates according to the hard decision values and the soft decision values; and
   a first serial-to-parallel converter, coupled to the first error detector, for performing serial-to-parallel conversion on the sequence of first error estimates to generate two or more parallel paths of first error estimates; and
   a compensation circuit, coupled to the calculating circuit, for compensating the time-interleaved parallel ADC circuit according to at least part of the two or more parallel paths of first error estimates.

2. The receiver of claim 1, wherein the compensation circuit further comprises:
   a controllable oscillator, coupled to the calculating circuit, for generating the clock signals of different phases according to at least part of the two or more parallel paths of first error estimates; and
   a delay circuit, coupled to the controllable oscillator, the calculating circuit and the time-interleaved parallel ADC circuit, for adjusting the clock phase for at least part of the clock signals according to at least part of the two or more parallel paths of first error estimates.

3. The receiver of claim 2, wherein the compensation circuit further comprises: a plurality of adjustable gain stages, coupled to the ADCs, respectively; and wherein the calculating circuit is utilized for adjusting a plurality of gain values utilized by the gain stages according to the two or more parallel paths of first error estimates.

4. The receiver of claim 1, wherein the two or more parallel paths of first error estimates further comprise a reference error estimate and one or more relative error estimates.

5. The receiver of claim 4, wherein the controllable oscillator generates the clock signals of different phases based on the reference error estimate.

6. The receiver of claim 4, wherein the delay circuit further comprises one or more one variable delay units, each controlled by one relative error estimate.

7. The receiver of claim 6, wherein the calculating circuit further comprises:
   one or more subtracting units, each calculating the difference between the one of the relative error estimates and the reference error estimate.

8. The receiver of claim 1, wherein the calculating circuit further comprises:
   a second error detector to generate a sequence of second error estimates according to the soft decisions and the hard decisions; and
   a second serial-to-parallel converter, coupled to the second error detector, for performing serial-to-parallel conversion on the sequence of second error estimates into two or more paths of second error estimates.

9. The receiver of claim 8, wherein the calculating circuit further comprises:
   a plurality of loop filters, coupled to the second serial-to-parallel converter, for filtering the two or more paths of second error estimates, respectively.

10. The receiver of claim 1, wherein the calculating circuit further comprises:
    a plurality of loop filters, coupled to the first serial-to-parallel converter, for filtering the two or more parallel paths of first error estimates, respectively.

11. A compensation method for a receiver, comprising:
receiving and processing an incoming signal to generate an analog input signal;
utilizing a time-interleaved parallel analog-to-digital converter (ADC) for converting the analog input signal to a digital input signal according to a plurality of clock signals of different phases;
equalizing the digital input signal to generate a plurality of soft decision values; generating a plurality of hard decision values according to the soft decision values;
generating a sequence of first error estimates according to the hard decision values and the soft decision values;
performing serial-to-parallel conversion on the sequence of first error estimates to generate two or more parallel paths of first error estimates; and
compensating the receiver according to at least part of the two or more parallel paths of first error estimates.

12. The method of claim 11, wherein the step of compensating comprises:
generating the clock signals of different phases and then adjusting phases of at least part of the clock signals according to at least part of the two or more parallel paths of first error estimates to correct the timing errors among the clock signals.

13. The method of claim 12, wherein the two or more parallel paths of first error estimates further comprises a reference timing error value and one or more relative timing error values.

14. The method of claim 13, wherein the step of generating the clock signals of different phases further comprises generating the clock signals of different phases based on the reference timing error value.

15. The method of claim 14, wherein adjusting phases of at least part of the clock signals further comprises:
adjusting the phase for one or more clock signals, each using one of the relative timing error values.

16. The method of claim 15, wherein calculating the timing error values further comprises:
subtracting the timing error estimate of the reference path from the timing error estimates of the relative paths, respectively.

17. The method of claim 11, wherein calculating the timing error values further comprises:
filtering the two or more parallel paths of first error estimates.

18. The method of claim 11, wherein the step of compensating comprises:
adjusting a plurality of gain values to be utilized by gain stages of the time-interleaved parallel ADC circuit according to the two or more parallel paths of first error estimates.

19. The method of claim 11, further comprising:
generating a sequence of second error estimates using the soft decisions and the hard decisions; and
converting the sequence of second error estimates into two or more parallel paths of second error estimates using a serial-to-parallel conversion.

20. The method of claim 19, wherein generating the sequence of second error estimates further comprises:
filtering the two or more parallel paths of second error estimates.

21. The method of claim 11, wherein the step of compensating comprises:
adjusting phases of at least part of the clock signals according to at least part of the two or more parallel paths of first error estimates.

* * * * *